United States Patent
Iijima (10) Patent No.: US 10,325,734 B1
(45) Date of Patent: Jun. 18, 2019

(54) KEYBOARD SWITCH

(71) Applicant: TOPRE CORPORATION, Tokyo (JP)

(72) Inventor: Yasuhiro Iijima, Kanagawa (JP)

(73) Assignee: TOPRE CORPORATION, Tokyo (JP)

( * ) Notice: Subject to any disclaimer, the term of this patent is extended or adjusted under 35 U.S.C. 154(b) by 0 days.

(21) Appl. No.: 15/883,421

(22) Filed: Jan. 30, 2018

(51) Int. Cl.
*H01H 13/14* (2006.01)
*H01H 3/12* (2006.01)

(52) U.S. Cl.
CPC .............. *H01H 13/14* (2013.01); *H01H 3/12* (2013.01)

(58) Field of Classification Search
CPC ................................. H01H 13/14; H01H 3/12
USPC ............................................................ 200/341
See application file for complete search history.

(56) References Cited

U.S. PATENT DOCUMENTS

| | | | |
|---|---|---|---|
| 5,516,996 A | 5/1996 | Shin | |
| 8,878,085 B2 * | 11/2014 | Lin | G06F 3/0202 200/292 |
| 2010/0116629 A1* | 5/2010 | Borissov | H01H 25/008 200/4 |

FOREIGN PATENT DOCUMENTS

| | | | |
|---|---|---|---|
| EP | 1528583 | 5/2005 | |
| JP | 08329770 A | 12/1996 | |
| JP | 2012-138254 | 7/2012 | |
| JP | 2012138254 | * 7/2012 | .......... H01H 13/705 |
| JP | 2018032508 A | 3/2018 | |

OTHER PUBLICATIONS

European Patent Application No. 18154328.1, Extended European Search Report, dated Aug. 9, 2018, 7 pages.

* cited by examiner

*Primary Examiner* — Renee S Luebke
*Assistant Examiner* — Iman Malakooti
(74) *Attorney, Agent, or Firm* — Kilpatrick Townsend & Stockton LLP (57) ABSTRACT

A keyboard switch includes a key top movable vertically on receiving a depressing force, a plunger engaged with a lower portion of the key top and movable vertically with the key top, a cup rubber disposed under the plunger and supporting the plunger from below, a housing arranged on an outer peripheral side of the plunger and cup rubber, a plate supported on the housing and extending laterally, and a spacer interposed between the plate and key top. The spacer is removably mounted onto the keyboard.

5 Claims, 8 Drawing Sheets

KEYBOARD SWITCH

BACKGROUND

1. Field of the Invention

The invention relates to a keyboard switch for use in an input device (for example, a keyboard) which inputs information into electronic equipment.

2. Description of Related Art

JP-A-08-329770 discloses a keyboard switch for use in an input device (for example, a keyboard) which inputs information into electronic equipment. In the keyboard switch, common key strokes are set to all keyboard switches on the keyboard.

Recently, needs of keyboards become diversified. Users may use different keyboards depending on a purpose of use. For example, when playing a game or the like, for quick hitting of a specified key, the users want to use a short key stroke keyboard. In normal times other than the game or the like, the users want to use a long key stroke keyboard.

That is, since the users are required to change keyboard depending on the purpose of use, and the users are bothered.

SUMMARY

In accordance with embodiments of the invention, a keyboard switch which can change a stroke of a specified key in a single keyboard is provided.

According to embodiments, a keyboard switch includes a key top movable vertically on receiving a depressing force, a plunger engaged with a lower portion of the key top and movable vertically with the key top, a cup rubber disposed under the plunger and supporting the plunger from below, a housing arranged on an outer peripheral side of the plunger and cup rubber, a plate supported on the housing and extending laterally, and a spacer interposed between the plate and key top. The spacer is removably mounted onto the keyboard.

Other aspects and advantages of the invention will be apparent from the following description and the appended claims.

DETAILED DESCRIPTION

Embodiments are described in the below with reference to drawings.

A keyboard switch according to embodiments may be used in a keyboard serving as an input device for inputting information into electronic equipment.

First Exemplary Embodiment

Firstly, description is given of a first exemplary embodiment.

As shown in FIGS. 1 to 5B, a keyboard 1 includes thereon multiple keys arranged in parallel along the lateral direction and longitudinal direction thereof.

A keyboard switch 3 includes a key top 5 movable vertically on receiving a depressing force from an operator, a plunger 7 engaged with the lower portion of the key top 5 and movable vertically together with the key top 5, a cup rubber 9 disposed under the plunger 7 for supporting it from below, a housing 11 arranged on the outer peripheral side of the plunger 7 and cup rubber 9, a plate 13 supported on the housing 11 and extending laterally, a spacer 15 interposed between the plate 13 and key top 5, and a coil spring 17 arranged under the cup rubber 9. The spacer 15 can be removably mounted onto the keyboard 1. Also, the keyboard switch 3 is arranged on a board 19. Specific description is given below.

Figure 3:
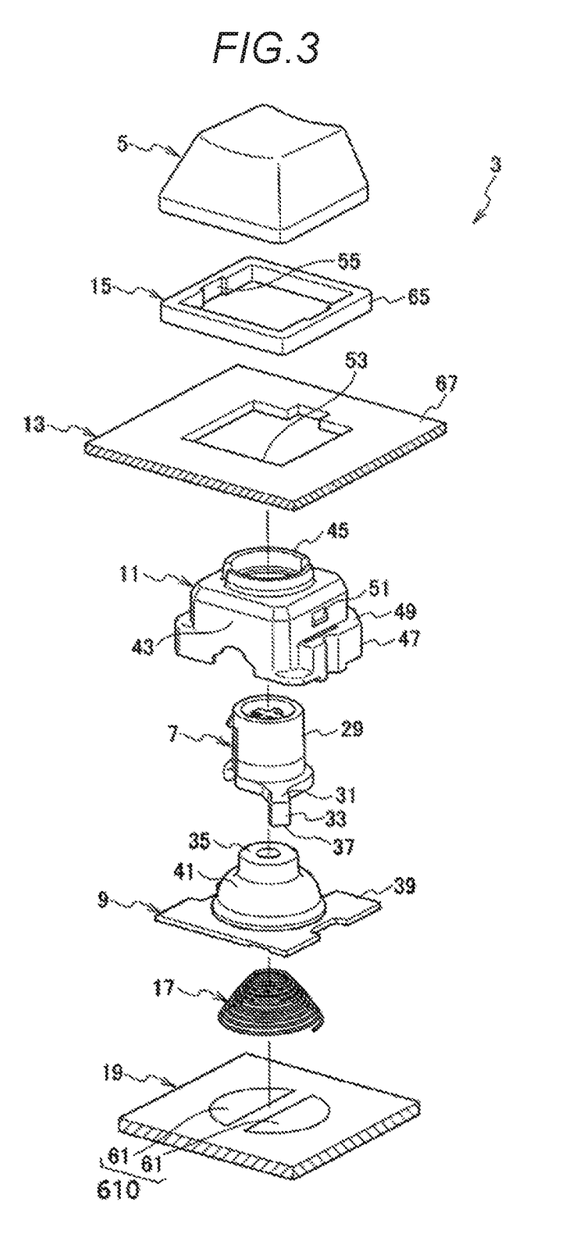
FIG. 3 is an exploded perspective view of the keyboard switch according to the first exemplary embodiment.
Figure 4:
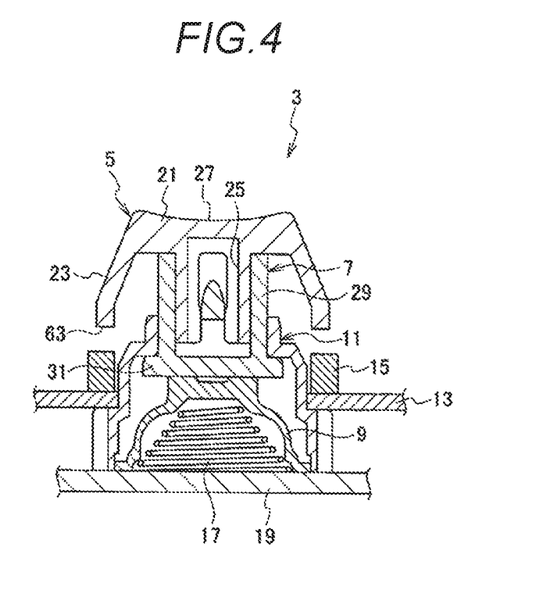
FIG. 4 is a section view of the keyboard switch of FIG. 3 after assembled.

According to the exemplary embodiment, the key top 5 is formed of a material such as a synthetic resin. The key top 5 includes: a key top main body part 21 having an outer periphery formed in a truncated pyramid shape; a side surface part 23 extending obliquely downward from the outer peripheral end of the key top main body part 21; and, a cylindrical connecting tube part 25 extending downward from the central portion of the lower surface of the key top main body part 21 and engageable with the plunger 7. The upper surface of the key top main body part 21 is formed as a depressing surface 27. In its side view, a central portion in the right and left direction of the upper surface of the key top main body part 21 is formed in a downward recessed curved shape so that an operator can easily press it with his/her finger.

According to exemplary embodiment, the plunger 7 is formed of a material such as a synthetic resin. The plunger 7 is vertically movable together with the key top 5. It is integrally constituted of a cylindrical part 29 arranged on its upper side, a contact part 31 extending laterally from the lower end of the cylindrical part 29, and a pawl part 33 bent in the tip end of the contact part 31 and extending downward. The contact part 31 is contactable with a depressing part 35 of the cup rubber 9 (to be discussed later), while the lower end 37 of the pawl part 33 is contactable with the base part 39 of the cup rubber 9.

The cup rubber 9 may be formed of a material such as an elastic rubber. The cup rubber 9 is arranged on the underside of the plunger 7. It is integrally constituted of a depressing part 35 forming an upper surface thereof, a cylindrical leg part 41 extending downward from the outer peripheral edge of the depressing part 35, and a flat base part 39 spreading laterally from the lower end of the leg part 41.

The housing 11 may be formed of a material such as a synthetic resin. The housing is integrally constituted of a rectangular cylindrical housing main body 43 disposed on the lower side of the housing 11 and a cylindrical connecting projection part 45 disposed on the upper side of the housing main body 43. On the lower portion of the housing main body 43, there is formed a laterally projecting portion 47 and, on the upper end of the projecting portion 47, there is formed a support surface 49 for supporting the plate 13. On the side surface of the housing main body 43, there is formed a projection 51 existing above the support surface 49. Also, into the inner peripheral side of the connecting projection part 45, there is inserted the cylindrical part 29 of the plunger 7.

The plate 13 may be formed of a material such as metal or synthetic resin. The plate 13 has a rectangular opening 53 capable of inserting the housing 11 therein. The peripheral edge of the opening 53 is placed on the support surface 49 of the housing 11, and the support surface 49 and projection 51 of the housing 11 clamp the peripheral edge of the opening 53 from above and below.

Figure 1:
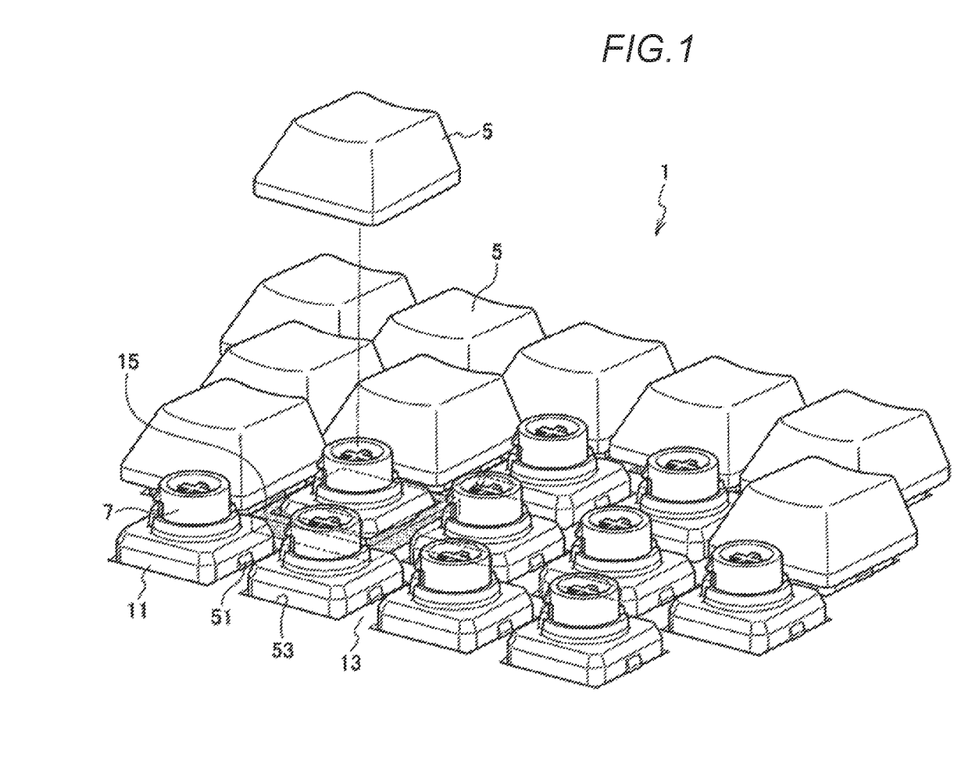
FIG. 1 is a perspective view of a keyboard switch according to a first exemplary embodiment.
Figure 2:
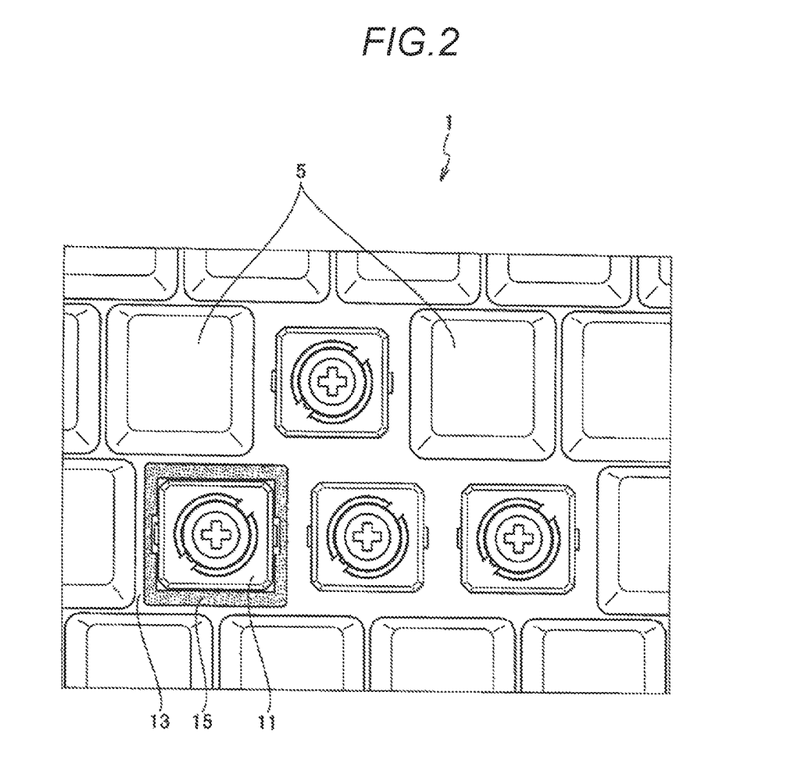
FIG. 2 is a plan view of the keyboard switch according to the first exemplary embodiment.
Figure 5A:
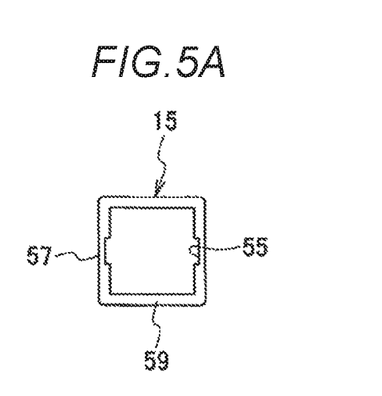
FIG. 5A is a plan view of a spacer according to the first exemplary embodiment.
Figure 5B:
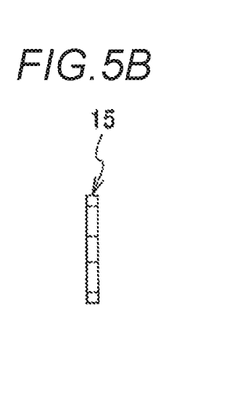
FIG. 5B is a side view of the spacer of FIG. 5A.

The spacer 15 may be formed of rubber such as urethane foam. Its material is not limited particularly as long as it is an elastic body. The spacer 15 is formed in a rectangular (annular) frame body in its plan view. According to the exemplary embodiment, the spacer 15 has a notch 55 on the inner peripheral side of the frame body. As shown in FIG. 5A, the spacer 15 may be formed in a square shape in its plan view. According to the exemplary embodiment, the spacer 15 is integrally constituted of a pair of opposed vertical side parts 57 extending in the vertical direction in FIG. 5A and a pair of lateral side parts 59 extending in the right and left direction. According to the exemplary embodiment, in the paired vertical side parts 57, on the inner peripheral sides of the central portions in the extending direction thereof, notches 55 may be formed. According to the exemplary embodiment, the spacer 15 is arranged at such key position as shown in FIGS. 1 and 2. However, the arrangement position of the spacer 15 is not limited particularly but can be selected arbitrarily.

According to the exemplary embodiment, the coil spring 17 is formed in a spiral shape in which, when no load is applied, its diameter increases gradually from the upper side to the lower side. The coil spring 17 is stored on the inner peripheral side of the cup rubber 9. The coil spring 17 is formed by winding a conductive coil wire in such a manner that it can be elastically deformed in the vertical direction.

On the surface of the board 19, there is provided a switch section 610 constituted of a pair of electrode parts 61 and 61. When the depressing part 35 of the cup rubber 9 is depressed to crush the coil spring 17, the coil spring 17 increases the electrical capacitive coupling amount between the paired electrode parts 61 and 61, thereby being able to detect that the key top 5 has been pressed by the switch mechanism.

Figure 6:
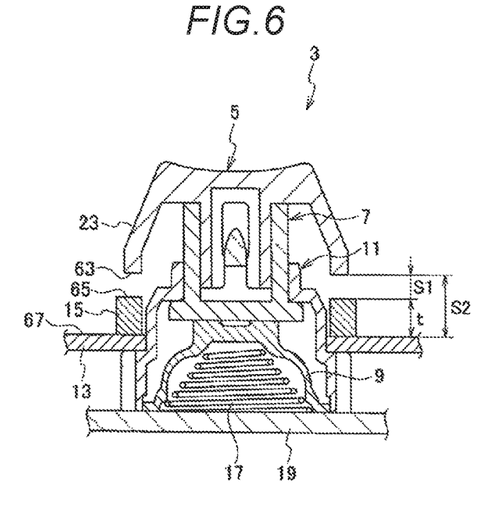
FIG. 6 is a section view of composing parts of the keyboard switch according to the first exemplary embodiment, showing the dimensions of the composing parts.

The dimensional relationships of the respective composing parts are described referring to FIG. 6

The vertical distance between the lower end 63 of the side surface part 23 of the key top 5 and the upper surface 65 of the spacer 15 is designated by S1, the vertical distance between the lower end 63 of the side surface part 23 of the key top 5 and the upper surface 67 of the plate 63 is designated by S2, and the thickness of the spacer 15 is designated by t. Thus, the relation of S2−S1=t holds. Here, the thickness t of the spacer 15 can be set to an arbitrary thickness.

When the depressing surface 27 of the key top 5 is pressed, the plunger 7 descends with the key top 5 and thus the lower end 63 of the side surface part 23 of the key top 5 hits the upper surface 65 of the spacer 15. While the spacer 15 elastically deforms slightly because it is an elastic body, when the spacer 15 is mounted, the vertical stroke of the key top 5 becomes almost S1. Meanwhile, unless the spacer 15 is mounted, when the depressing surface 27 of the key top 5 is pressed, the plunger 7 descends with the key top 5 and thus the lower end 63 of the side surface part 23 of the key top 5 hits the upper surface 67 of the plate 13. Therefore, unless the spacer 15 is mounted, the vertical stroke of the key top 5 becomes S2. As described above, the vertical stroke of the key top 5 becomes shorter when the spacer 15 is mounted.

Figure 7:
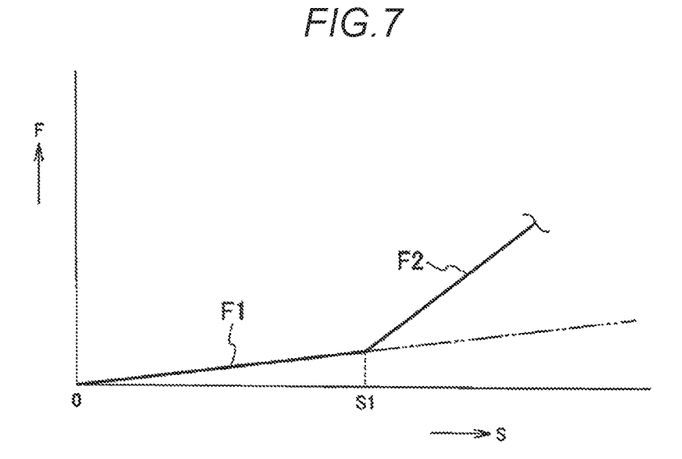
FIG. 7 is a schematic graph of the relationship between the key top depressed distance and the reaction force in the keyboard switch according to the first exemplary embodiment.

Further, description is given of the relation between the pressing force F and the stroke S of the key top 5 when the key top 5 is depressed, using the graph of FIG. 7.

When the key top 5 is depressed, the plunger 7 descends with the key top 5, whereby the cup rubber 9 and coil spring 17 are elastically deformed. The reaction forces of the cup rubber 9 and coil spring 17 allow the pressing force F1 to act until the stroke reaches the stroke S1. After then, when the lower end 63 of the side surface part 23 of the key top 5 hits the upper surface 67 of the plate 13, the reaction force of the spacer 15 is applied to thereby allow the pressing force F2 to act from the time of the stroke S1.

Effects provided by the first exemplary embodiment are described in the below.

(1) The keyboard switch 3 includes: the key top 5 movable vertically on receiving the depressing force; the plunger 7 connectable to (engageable with) the lower portion of the key top 5 and movable vertically with the key top 5; the cup rubber 9 disposed under the plunger 7 for supporting the plunger 7 from below; the housing 11 arranged on the outer peripheral side of these plunger 7 and cup rubber 9; the plate 13 supported on the housing 11 and extending laterally; and, the spacer 15 interposed between the plate 13 and key top 5. The spacer 15 can be removably mounted onto the keyboard 1.

Specifically, as shown in FIG. 1, after the key top 5 is removed using a jig, when the spacer 15 is mounted and the key top 5 is then assembled, the spacer 15 can be mounted onto a desired key. Therefore, in the case that the spacer 15 is interposed between the plate 13 and key top 5, when the key top 5 is depressed to hit the spacer 15, the vertical stroke of the key top 5 shortens to reduce the hitting sound as well. Thus, the interposition of the spacer is advantageous when an operator wants to hit a specified key quickly in a game or the like, or when the operator wants to increase the speed of inputting sentences.

Meanwhile, when the spacer 15 is not arranged, the vertical stroke of the key top 5 increases. Thus, the reaction force at the time of depression of the key top 5 increases, thereby increasing also the load that is applied to the finger of the operator.

Thus, since the operator can freely mount or remove the spacer 15, the operator need not change the keyboard 1 according to the object of use but can cope with various objects with the single keyboard 1.

(2) The arrangement position of the spacer 15 in the keyboard 1 can be selected arbitrarily.

Therefore, the operator can arrange the spacer 15 only in the key to be often used by the operator, thereby enabling customization of the keyboard 1 to a keyboard easy for the operator to use.

(3) The spacer 15 is formed of an elastic body. Therefore, since the spacer 15 is elastically deformed when the key top 5 is depressed to hit the spacer 15, the magnitude of hitting sound when the operator hits the key is reduced.

(4) The spacer 15 can be set to an arbitrary thickness. Therefore, the vertical stroke of the key top 5 can be changed arbitrarily according to the thickness of the spacer 15.

(5) The spacer 15 is formed in a rectangular (an annular) frame body in its plan view, and includes the notches 55 on the inner peripheral side of the frame body.

Due to inclusion of the notches 55 on the inner peripheral side of the frame body, when removing the spacer 15, the operator can insert his/her fingers into the notches 55 to grip it, thereby enabling enhancement in the working efficiency when mounting or removing the spacer 15.

(6) The spacer 15 is formed so as to correspond to one key in a keyboard. Therefore, the operator can mount the spacer 15 only on a desired specified key, thereby enabling enhancement in usability.

Second Exemplary Embodiment

A second exemplary embodiment is described referring to FIGS. 8 to 10B. The same composing elements as the first exemplary embodiment are given the same designations and the description thereof is omitted.

Figure 8:
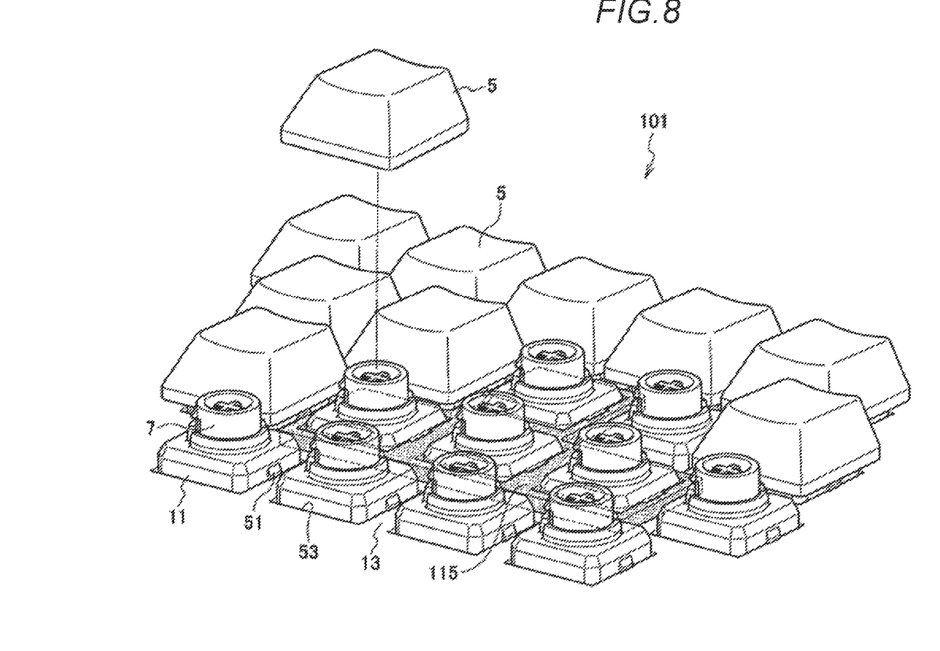
FIG. 8 is a perspective view of a keyboard switch according to a second exemplary embodiment.
Figure 9:
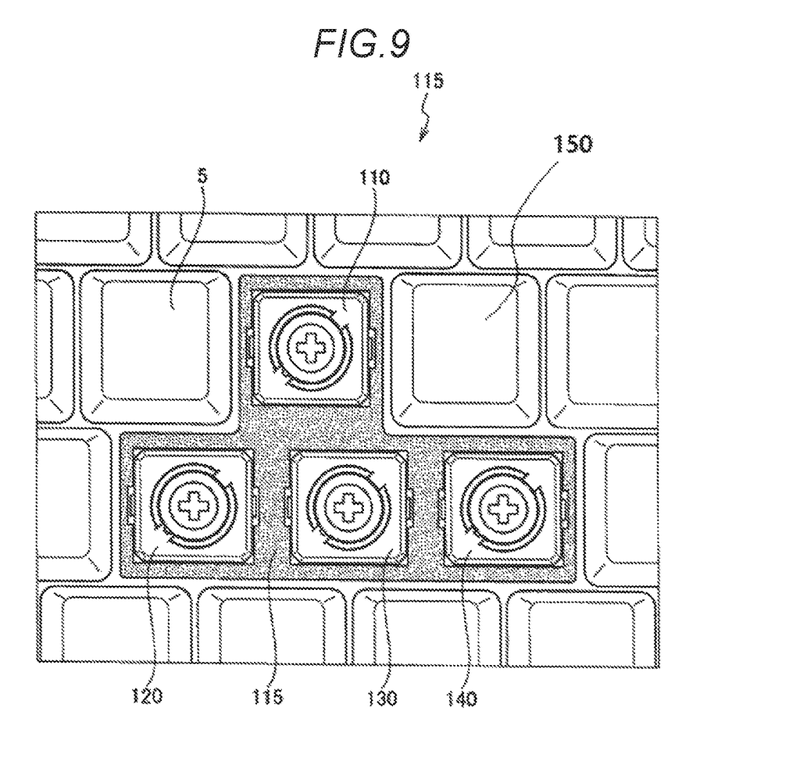
FIG. 9 is a plan view of the keyboard switch according to the second exemplary embodiment.
Figure 10A:
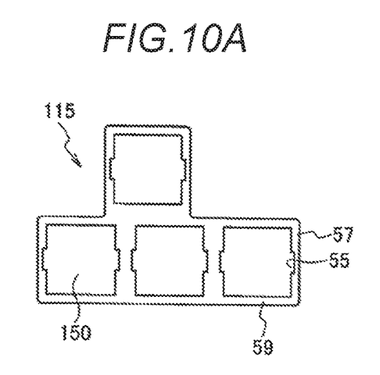
FIG. 10A is a plan view of a spacer according to the second exemplary embodiment.
Figure 10B:
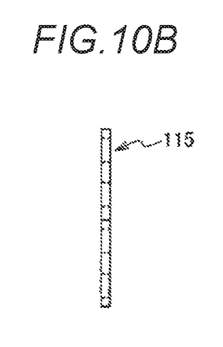
FIG. 10B is a side view of the spacer of FIG. 10A.

A spacer 115 according to the second exemplary embodiment is integrally formed to correspond to multiple adjacent keys on a keyboard 101. The spacer 115 is formed of rubber such as urethane foam but its material is not limited particularly as long as it is an elastic body.

Specifically, the spacer 115 shown in FIG. 10A, as shown in FIGS. 8 and 9, corresponds to four keys on the keyboard 101, that is, a W key 110, an A key 120, an S key 130 and a D key 140. These W key 110, A key 120, S key 130 and D key 140 are four adjacent keys which are used often in a game.

That is, the spacer 115 is constituted of four frame bodies connected together, each having a square shape in its plan view. Also, each frame body is formed in a rectangular (annular) frame body in a plan view and includes a notch 55 on its inner peripheral side. Specifically, as shown in FIG. 10A, each frame body is formed in a square shape in its plan view and is integrally constituted of a vertical side part 57 extending in the vertical direction in FIG. 10A and a lateral side part 59 extending in the right and left direction. Each of the pair of opposed vertical side parts 57 and 57 includes a notch 55 on the inner peripheral side of the central portion in the extending direction of the vertical side part 57.

Effects provided by the second exemplary embodiment are described in the below.

(1) The spacer 115 is formed integrally to correspond to multiple adjacent keys on the keyboard 101.

Therefore, for example, in a game, since the W, A, S and D keys are used often, the second exemplary embodiment can answer the need of the operator who wants to hit keys quickly.

Description has been given heretofore of the keyboards of the invention with reference to the illustrated embodiments. However, the invention is not limited to them but the configurations of the respective composing elements can be replaced with arbitrary configurations having similar functions.

Figure 11A:
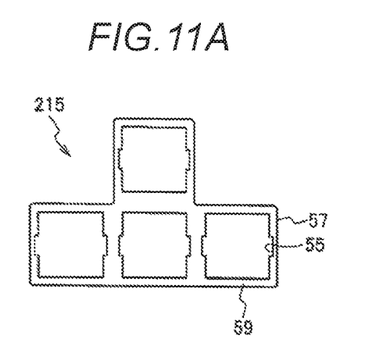
FIG. 11A is a plan view of a spacer according to a further exemplary embodiment.
Figure 11B:
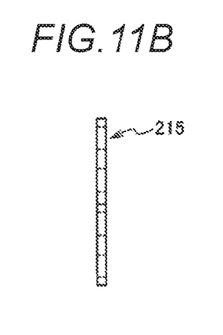
FIG. 11B is a side view of the spacer of FIG. 11A.

For example, in the above second exemplary embodiment, description is given of the spacer 115 corresponding to the W, A, S and D keys. However, as shown in FIG. 11, it is also possible to apply a spacer 215 which corresponds to direction keys.

According to embodiments, as shown in FIGS. 1 to 11B, a keyboard switch 3 includes a key top 5 movable vertically on receiving a depressing force, a plunger 7 engaged with a lower portion of the key top 5 and movable vertically with the key top 5, a cup rubber 9 disposed under the plunger 7 and supporting the plunger 7 from below, a housing 11 arranged on an outer peripheral side of the plunger 7 and the cup rubber 9, a plate 13 supported on the housing 11 and extending laterally, and a spacer 15, 115, 225 interposed between the plate 13 and the key top 5. The spacer 15, 115, 225 is removably mounted in a keyboard 1, 101.

According to embodiments, as shown in FIGS. 1 to 11B, a position of the spacer 15, 115, 225 on the keyboard 1, 101 is arbitrarily selectable.

According to embodiments, as shown in FIGS. 1 to 11B, the spacer 15, 115, 225 is formed of an elastic body.

According to embodiments, as shown in FIGS. 1 to 11B, the spacer 15, 115, 215 has a shape of an annular frame body in its plan view. The spacer 15, 115, 215 includes a notch 55 on an inner peripheral side of the annular frame body.

According to embodiments, as shown in FIGS. 1 to 11B, the housing 11 includes a support surface 49 and a projection 51. The plate 13 is formed with an opening 53. The housing 11 penetrates in the opening 53. The support surface 49 and the projection 51 clamp a peripheral edge of the opening 53 from above and below. The projection 51 is accommodated in the notch 55.

According to embodiments, as shown in FIGS. 1 to 11B, the spacer 15 corresponds to one key on the keyboard 1.

According to embodiments, as shown in FIGS. 1 to 11B, the spacer 115, 215 is integrally formed so as to correspond to multiple adjacent keys on the keyboard 101.

According to embodiments, as shown in FIGS. 1 to 11B, a keyboard 1, 101 includes a board 19, a plate 13, a first key 120, 130, 140, and a second key 150. Each of the first key 120, 130, 140 and the second key 150 includes a switch section 610 provided on the board 19, a key top 5 movable vertically on receiving a depressing force, a cup rubber 9 disposed below the key top 5, and a housing 11 arranged on an outer peripheral side of the cup rubber 9 and penetrating through an opening of the plate 13. A spacer 15, 115, 215 is arranged between the plate 13 and the key top 5 of the first key 120, 130, 140. No spacer is arranged between the plate 13 and the key top 5 of the second key 150.

According to embodiments, as shown in FIGS. 1 to 11B, the key board 101 includes a third key 120, 130, 140. The third key 120, 130, 140 includes a switch section 610 provided on the board 19, a key top 5 movable vertically on receiving a depressing force, a cup rubber 9 disposed below the key top 5, and a housing 11 arranged on an outer peripheral side of the cup rubber 9 and penetrating through an opening of the plate 13. The spacer 115, 215 has openings through which the housing 11 of the first key 120, 130, 140 and the housing 11 of the third key 120, 130, 140 respectively penetrate.

According to embodiments, as shown in FIGS. 1 to 11B, a replacement spacer having the same outer shape with the spacer 15, 115, 215 in its plan view and a thickness in a vertical direction which is different from a thickness with the spacer 15, 115, 215 is provided in a combination with the keyboard 1, 101.

According to embodiments, as shown in FIGS. 1 to 11B, a spacer 15, 115, 215 configured to be removably mounted in the keyboard 1, 101 is provided.

According to embodiments, as shown in FIGS. 1 to 11B, a method of mounting a spacer to a keyboard includes a step of removing the key top 5 from the keyboard 1, 101; a step of mounting a spacer 15, 115, 215 on the plate 13 of the keyboard 1, 101 in which the key top 5 is removed, and a step of mounting the key top 5 to the keyboard 1, 101 in which the spacer 15, 115, 215 is mounted.

According to the keyboard switch of the embodiments, the spacer can be removably mounted onto the keyboard. Therefore, in the case that the spacer is interposed between the plate and key top, when the key top is depressed to hit the spacer, the vertical stroke of the key top at the time of key entry is shortened and thus the hitting sound is also reduced. This provides an advantage when an operator wants to hit a specified key quickly in a game or the like, or when the operator wants to increase the speed of inputting a sentence.

Meanwhile, when the spacer is not arranged, the vertical stroke of the key top increases. Therefore, the reaction force produced when depressing the key top also increases, thereby increasing a load to be applied to the fingers of the user.

Thus, since the user can freely mount or remove the spacer, the stroke of a specified key can be changed with one keyboard.

DESCRIPTION OF REFERENCE NUMERALS

| 1, 101: Keyboard | 3: Keyboard switch | |
| 5: Key top | 7: Plunger | 9: Cup rubber |
| 11: Housing | 13: Plate | |
| 15, 115, 215: Spacer | 55: Notch | |

What is claimed is:

1. A keyboard switch comprising:
    a key top movable vertically on receiving a depressing force;
    a plunger engaged with a lower portion of the key top and movable vertically with the key top;
    a cup rubber disposed under the plunger and supporting the plunger from below;
    a housing arranged on an outer peripheral side of the plunger and the cup rubber, the housing including a support surface and a projection;
    a plate supported on the housing and extending laterally, the plate being formed with an opening; and
    a spacer interposed between the plate and the key top, wherein the spacer:
        is removably mounted in a keyboard;
        has a shape of an annular frame body in its plain view; and
        includes a notch on an inner peripheral side of the annular frame body; and
    wherein:
        the housing penetrates in the opening;
        the support surface and the projection clamp a peripheral edge of the opening from above and below; and
        the projection is accommodated in the notch.

2. The keyboard switch according to claim 1, wherein a position of the spacer on the keyboard is arbitrarily selectable.

3. The keyboard switch according to claim 1, wherein the spacer is formed of an elastic body.

4. The keyboard switch according to claim 1, wherein the spacer corresponds to one key on the keyboard.

5. The keyboard switch according to claim 1, wherein the spacer is integrally formed so as to correspond to multiple adjacent keys on the keyboard.

* * * * *